United States Patent [19]
Hurd

[11] Patent Number: 5,804,966
[45] Date of Patent: Sep. 8, 1998

[54] VOLUME SPECTROSCOPY HAVING IMAGE ARTIFACT REDUCTION

[75] Inventor: Ralph E. Hurd, Milpitas, Calif.

[73] Assignee: General Electric Company, Milwaukee, Wis.

[21] Appl. No.: 711,496

[22] Filed: Sep. 10, 1996

[51] Int. Cl.[6] .................................................. G01R 33/20
[52] U.S. Cl. ............................................................ 324/309
[58] Field of Search .................................... 324/300, 307, 324/309; 128/653.2, 653.3; 600/410

[56] References Cited

U.S. PATENT DOCUMENTS

| | | | |
|---|---|---|---|
| 4,480,228 | 10/1984 | Bottomley . | |
| 4,694,254 | 9/1987 | Vatis et al. | 324/309 |
| 4,748,409 | 5/1988 | Frahm et al. . | |
| 5,317,261 | 5/1994 | Den Hollander et al. | 324/309 |

OTHER PUBLICATIONS

J. C. Haselgrove et al., "*In vivo One–Dimensional Imaging of Phosphorus Metabolites by Phosphorus–31 Nuclear Magnetic Resonance*," 10 Jun. 1983, Science, vol. 220, p. 1170 to p. 1173.

M. Decorps et al., "Localized Spectroscopy Using Static Magnetic Field Gradients: Comparison of Techniques," *NMR Basic Principles and Progress*, 1992, vol. 27, pp. 120 to 149.

Susan Kohler, "*Probe\SV, Data acquisition*" and *Probe\SV, Data processing Display and Storage*, 1993, vol. V, p. 16 and p. 18.

Peter G. Webb, "*Automated Single–Voxel Proton MRS: Technical Development and Multisite Verification*," Magnetic Resonance in Medicine, vol. 31, 1994, p. 365 to p. 373.

*Primary Examiner*—Sandra L. O'Shea
*Assistant Examiner*—Michael Eisenberg
*Attorney, Agent, or Firm*—Henry K. Woodward; John H. Pilarski

[57] ABSTRACT

Susceptibility artifacts in slice selective volume magnetic resonance spectroscopy are reduced by applying phase encoding at a nominal resolution equal to or larger than the slice selection dimensions. In a preferred embodiment of the method, phase encoding is applied along the axes of the first and last RF slice selections. The volume of interest is contained completely within a single pixel defined by the 2D phase encoding. Unsuppressed water reference signal from the volume of interest is relatively unaffected by these artifacts and is collected without phase encoding.

4 Claims, 5 Drawing Sheets

\* = artifacts

VOLUME SPECTROSCOPY HAVING IMAGE ARTIFACT REDUCTION

BACKGROUND OF THE INVENTION

This invention relates generally to magnetic resonance spectroscopy, and more particularly, the invention relates to volume spectroscopy in which a localized spectrum from a volume may be obtained in a single scan.

Volume localized magnetic resonance spectroscopy has become a useful and routine clinical tool especially for the detection of abnormalities which lead to diffused chemical changes in brain tissue. Several techniques are known for directly exciting spins in a volume of interest and achieving three-dimensional selection including use of stimulated echoes and the use of Carr-Purcell echoes. These techniques obtain a localized spectrum in a single scan. For example, point resolved spectroscopy (PRESS, see U.S. Pat. No. 4,480,228) uses a three pulse sequence with each pulse being frequency selective.

One of the most difficult challenges that remain for these methods is the deleterious effect of large magnetic susceptibility gradients which naturally occur in many regions of the brain and which can occur in the region of interest for some focal pathologies. These gradients lead to failure of automation or can lead to artifacts which render the data useless. These artifacts occur in both PRESS and stimulated echo acquisitions. In PRESS for example, a susceptibility gradient along the axis of the first slice selection (P1) or the third slice selection (P3) are more likely to result in artifacts than the same susceptibility gradient along the axis of the second slice selection pulse (P2). Thus, gradient order can be used to defeat a susceptibility gradient along a single axis. Unfortunately, susceptibility gradients do not always limit themselves to a single axis, and a more general solution to the problem is needed.

SUMMARY OF THE INVENTION

The present invention makes use of phase encoding at or larger than the single voxel resolution to resolve and thus eliminate any susceptibility artifacts from these single voxel spectra.

The preferred embodiment of the invention uses phase encoding along the P1 and P3 slice selection axes to achieve artifact reduction. Briefly, the object to be imaged is placed in a static magnetic field, and then a sequence of three RF pulses are applied through the object in the presence of slice select gradients along each of three principal axes, each RF pulse exciting a plane perpendicular to the applied gradient axis. The three RF pulses collectively stimulate an echo from a volume of interest, which is intersected by each of the excited planes. Importantly, the phase encoding gradients are added to resolve and eliminate any susceptibility artifacts from outside the volume of interest. Normally the P2 slice selection axis is free of artifacts and does not require phase encoding to yield a normal spectrum. Additionally, a sequence of spoiling gradients is applied to dephase signals out of the volume of interest and to dephase water molecule spins throughout the excited volume. A localized spectrum signal is then detected from the volume intersected by each excited plane.

Additionally, by choosing the resolution of the spectroscopy image to be the volume of interest, the spectroscopy image grid can be automatically shifted to capture a prescribed single voxel totally within a single pixel. This eliminates the problem of the spectral response function and its concomitant impact on localization, a well-known limiting feature of conventional spectroscopic imaging where resolution is smaller than the excited volume. Alternatively, small grid shifts can be made to eliminate certain partial volume effects and chemical shift artifacts in post-processing of the data.

The invention and objects and features thereof will be more readily apparent from the following detailed description and appended claims when taken with the drawings.

DETAILED DESCRIPTION OF ILLUSTRATED EMBODIMENTS

Figure 1A:
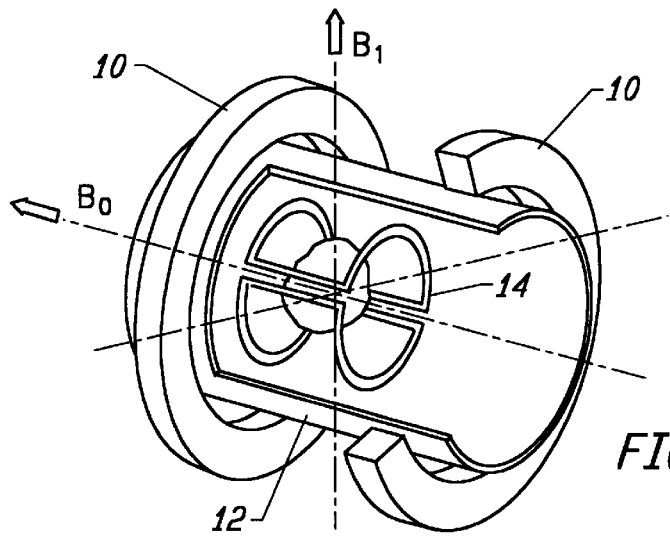
FIGS. 1A–1D illustrate the arrangement of conventional MRI apparatus and magnetic fields generated therein.
Figures 1B, 1C, 1D:
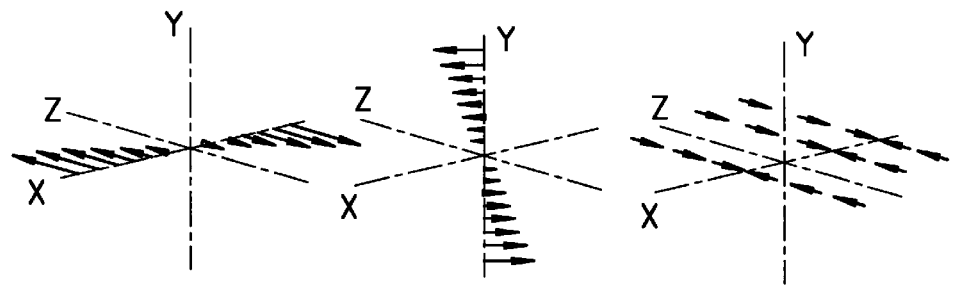

Referring now to the drawings, FIG. 1A is a perspective view partially in section illustrating coil apparatus in an MRI system, and FIGS. 1B–1D illustrate field gradients which can be produced in the apparatus of FIG. 1A. This apparatus is discussed in Hinshaw and Lent, "An Introduction to NMR Imaging: From the Bloch Equation to the Imaging Equation," *Proceedings of the IEEE*, Vol. 71, No. 3, March 1983, pps. 338–350. Briefly, the uniform static field $B_0$ is generated by the magnet comprising the coil pair 10. A gradient field $G(x)$ is generated by a complex gradient coil set which can be wound on the cylinder 12. An RF field $B_1$ is generated by an RF coil 14. A sample being studied would be positioned along the Z axis within the RF coil 14.

In FIG. 1B, an X gradient field is shown which is perpendicular to the static magnetic field $B_0$ and varies linearly with distance along the X axis but does not vary with distance along the Y or Z axes. FIGS. 1C and 1D are similar representations of the Y gradient and Z gradient fields, respectively.

Figure 2:
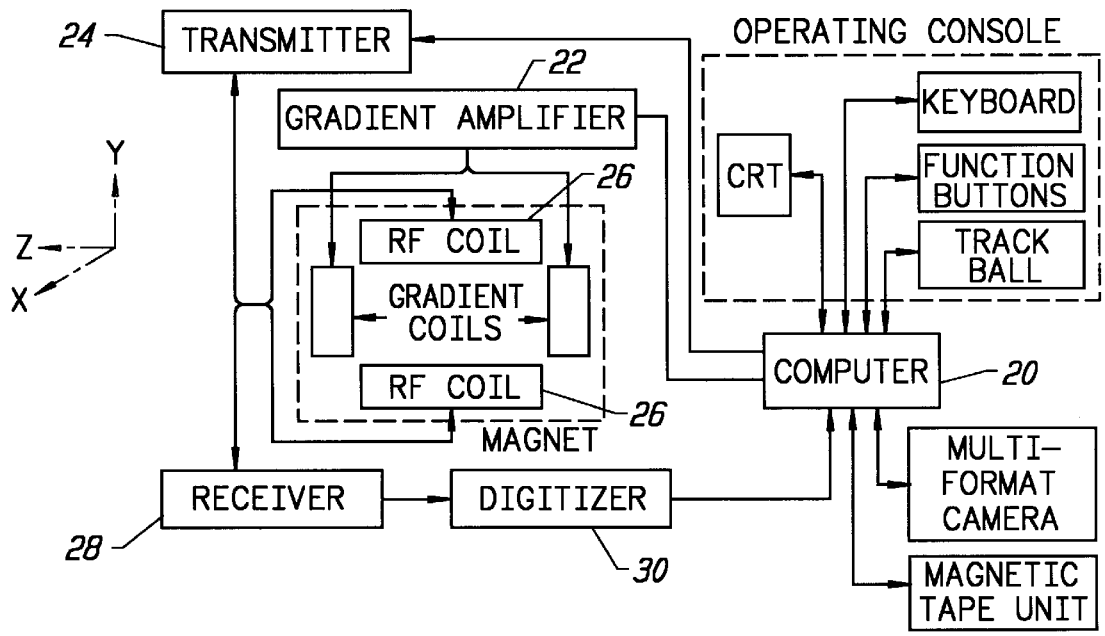
FIG. 2 is a functional block diagram of MRI and spectroscopy apparatus.

FIG. 2 is a functional block diagram of NMR apparatus. A computer 20 is programmed to control the operation of the MRI apparatus and process FID signals detected therefrom. The gradient field is energized by a gradient amplifier 22, and the RF coils for generating $B_1$ field at the Larmour frequency are controlled by the transmitter 24 and the RF coil 26. After the selected nuclei have been excited, the RF coils 26 are employed to detect the FID signal which is passed to the receiver 28 and then through digitizer 30 for processing computer 20.

Figure 3:
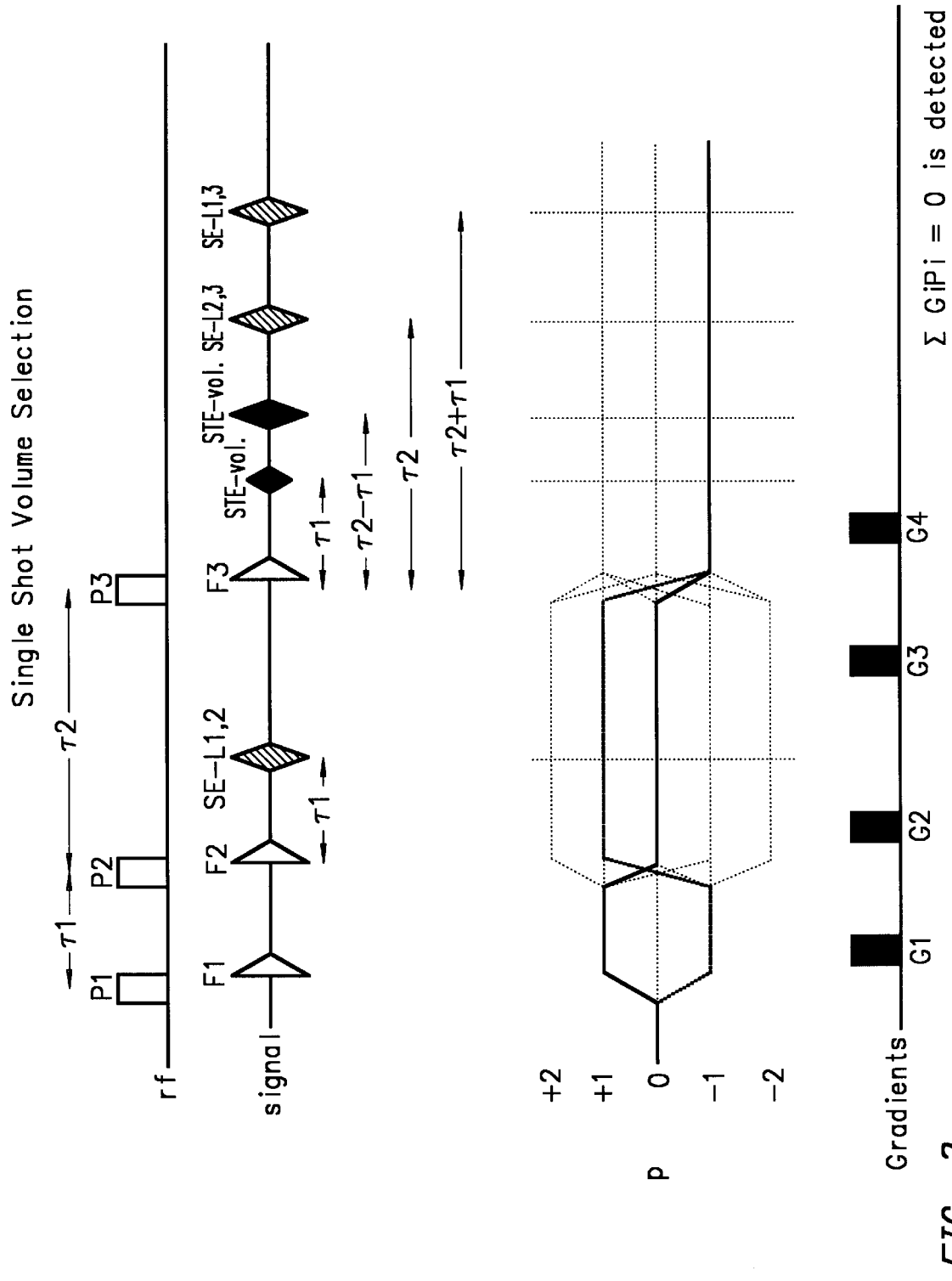
FIG. 3 illustrates RF pulses, gradients and echo signals in practicing volume spectroscopy in accordance with the invention.

FIG. 3 is a generalized diagram of RF pulses, gradients, and echo signals using single shot volume selection. The RF pulses P1, P2, P3 are frequency selective and are applied to the volume of interest with a delay $\tau 1$ between P1 and P2 and a delay $\tau 2$ between P2 and P3. The three RF pulses are applied concurrently with slice selection gradients. Gradients (G1, G2, G3, and G4) are calculated to spoil the free induction decay responses (F1, F2, F3) from each of the RF pulses, spoil the spin echoes generated by the intersection of two of the slice selection planes (SE-L1,2; SE-L2,2; SE,L1, 3) and finally spoil one of the volume echoes (STE-vol or SE-vol). Conversely, the gradient integrals are calculated to completely rephase the volume echo of interest (e.g., SE-vol).

As noted above, volume localized magnetic resonance spectroscopy has become a useful and routine clinical tool especially for the detection of abnormalities which lead to diffuse chemical changes in brain tissue. PRESS and stimulated echo acquisitions are two known techniques for implementing volume localized MR spectroscopy with the apparatus of FIGS. 1 and 2. However, spectral artifacts occur in both PRESS and stimulated echo acquisitions. The desired signal in both methods is a "volume" echo generated at the confluence of all three orthogonal RF/selection planes. Three RF pulses (P1, P2 and P3) are used to generate these volume echoes. Echoes are also generated in the sequences by three individual pairs of RF pulses (i.e., P1-P2, P2-P3, and P1-P3) and these are labelled SE-L1,2 SE-L2,3, and SE-L1,3. Normally, the unwanted part of the signal in the resulting three orthogonal lines (or columns) of spins is spoiled using the sequence of large crusher gradients. Unfortunately, the presence of strong susceptibility gradients (or even rapid homogeneity fall off outside the volume of interest) can generate unwanted artifact signals which are too large to eliminate by spoiling alone.

The worst case is when the water signal within one of the columns of spins is shifted outside of the water suppression stop band and into the desired chemical shift pass band. This unwanted signal can be three orders of magnitude larger than the signals of interest and is therefore difficult to fully spoil. Gradient order can help, however, since it is well known that the SE-L1,3 is more efficiently spoiled then SE-L1,2 and yet again more efficiently spoiled that SE-L2,3. Thus, if a strong susceptibility or homogeneity gradient is present along the Y axis, for example, it would be best to use a gradient order of X Y Z or Z Y X. This slice selection gradient forces the column of spins along the troublesome Y axis (generated by the X and Z slice selections) to be a SE-L1,3 echo which can be most efficiently crushed. However, the susceptibility gradients do not always limit themselves to a single axis.

Figures 4A, 4B:
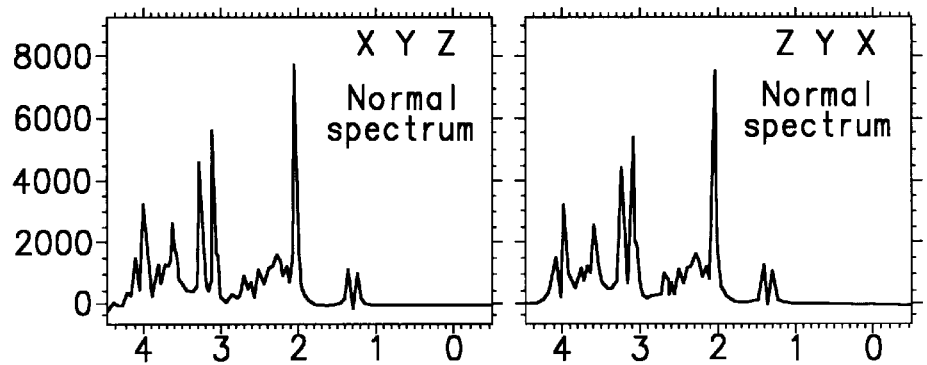
FIG. 4 illustrates gradient slice selection order with a normal spectrum and artifacts.
Figures 4C, 4D:
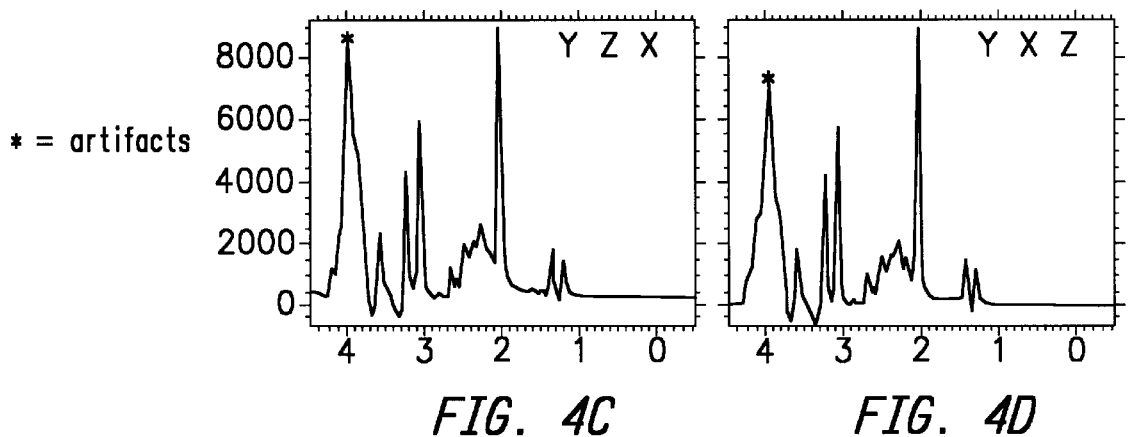
Figures 4E, 4F:
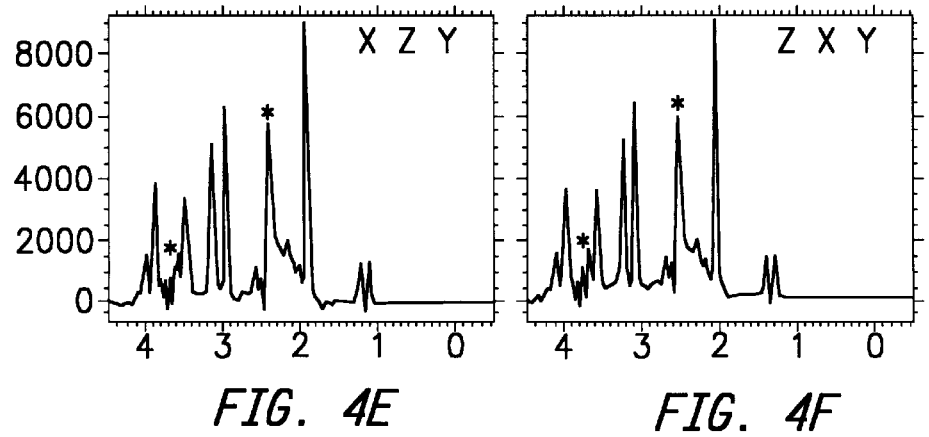

FIGS. 4A–4F illustrate the presence of artifacts in volume spectroscopy due to a susceptibility gradient along the Y axis in the volume being examined. A susceptibility gradient along the axis of the first slice selection (P1) or the third slice selection (P3) will result in artifacts as shown in FIGS. 4C–4F. The same susceptibility gradient along the axis of the second slice selection (P2), however, should be free of these artifacts and yield a normal spectrum as illustrated in FIGS. 4A and 4B. Thus, gradient order can be used to defeat a susceptibility gradient along the single axis, but not when the gradient is along two or more axes.

Figure 5:
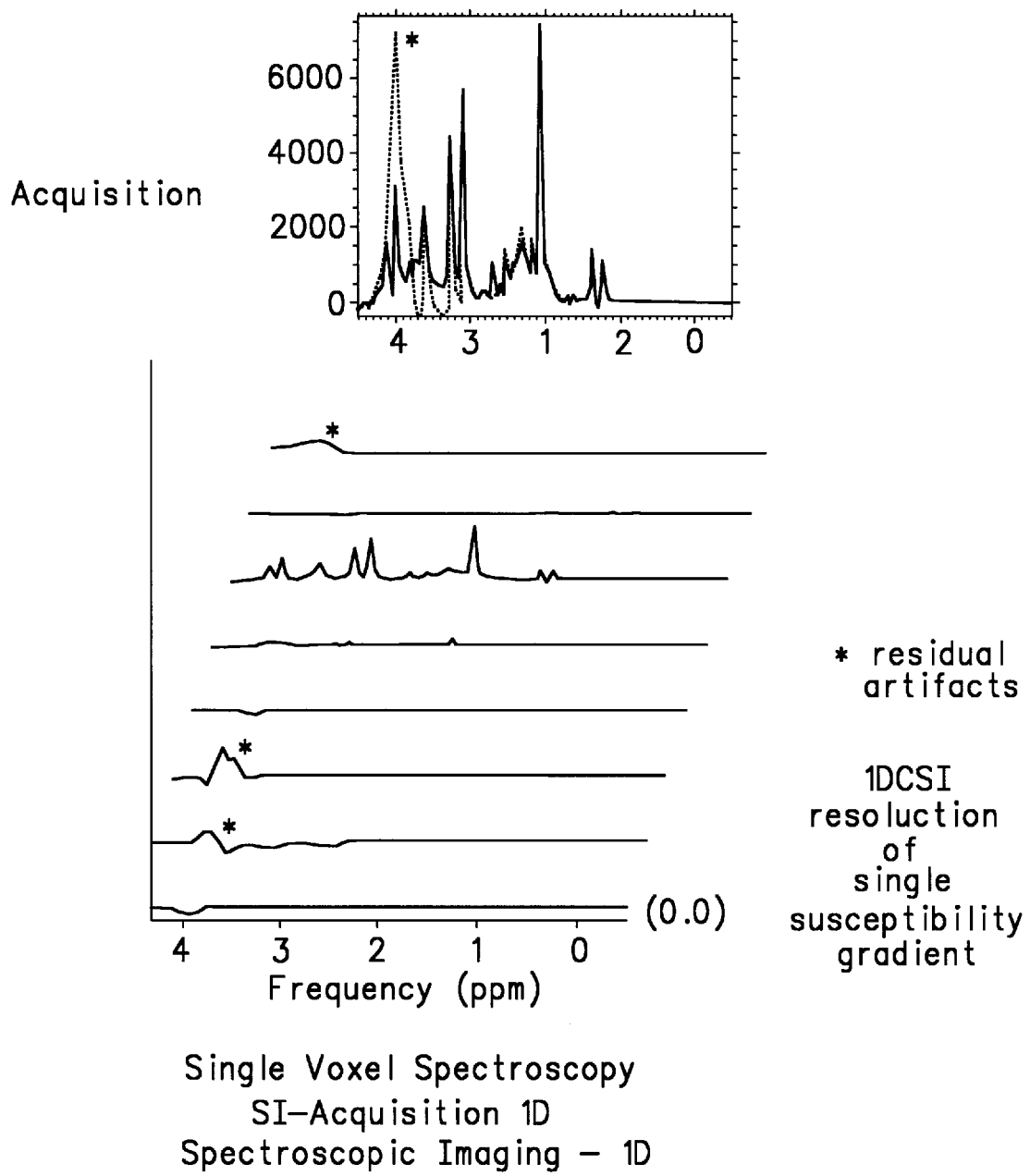
FIGS. 5 and 6 illustrate resolution of susceptibility artifacts in accordance with the invention.
Figure 6:
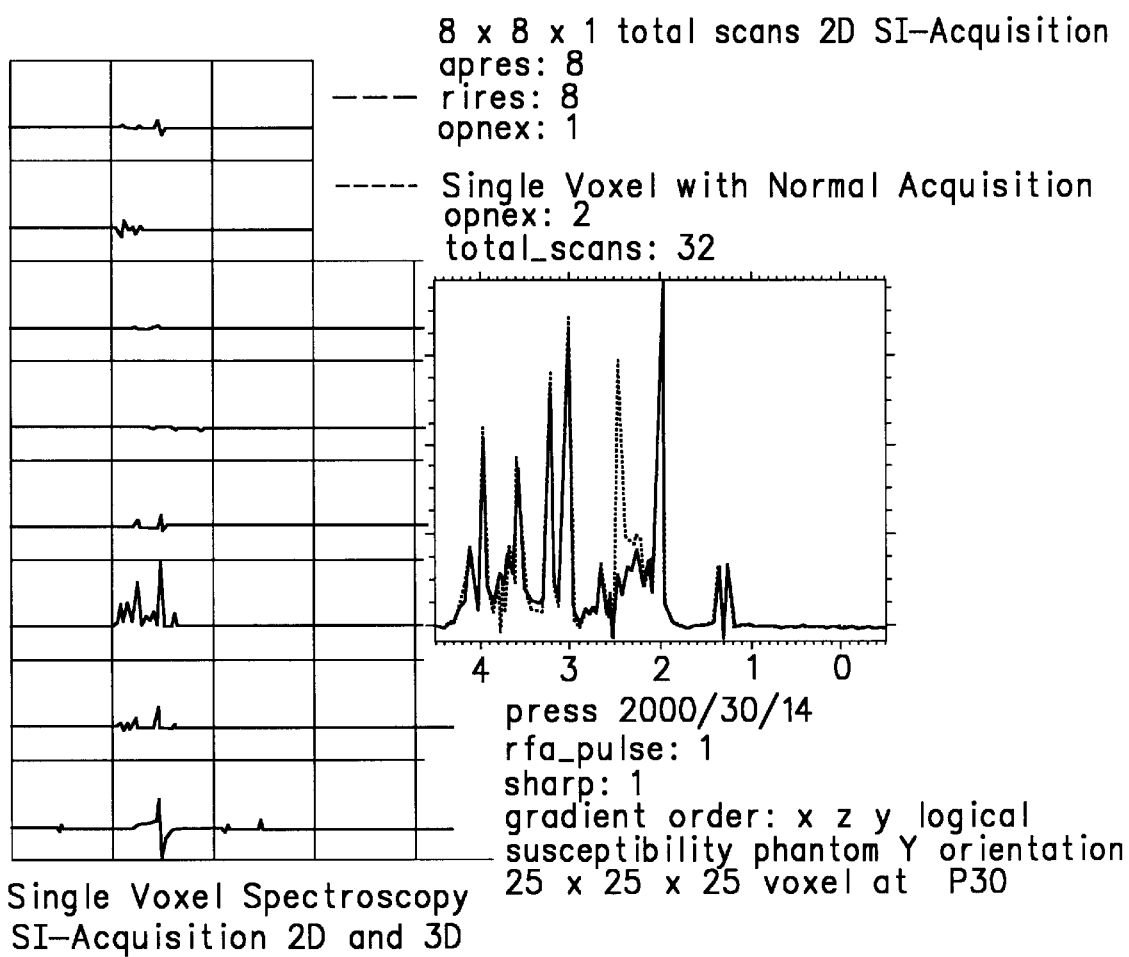

In accordance with the invention, the use of phase encoding at the single voxel resolution in the P1 and P3 slice axes resolve and eliminate susceptibility artifacts from the single voxel spectrum. This resolution is illustrated in FIG. 5 for one-dimensional phase-encoded acquisition of single voxel spectroscopy and in FIG. 6 for two-dimensional phase encoded single voxel spectroscopy. The normal single voxel acquisition in accordance with the prior art includes a residual artifact while the acquisition using phase encoding reduces or eliminates the residual artifacts. Phase encoding as a primary method of spatial localization is well-known in the art. See for example, Diehl et al., *NMR Basic Principles and Progress*, Springer-Verlag, 19921 and particularly the section by Decorps and Bourgeois on Phase Encoding Techniques. In conventional imaging and spectroscopic methods, phase encoding is used to resolve a volume or further resolve a slice (or slab) of spins. In the present invention, slice selection is used to define the volume of interest. Phase encoding is only used to eliminate out of volume susceptibility artifacts.

The invention is readily implemented in the PROBE (proton brain examination) technique described by Webb, et al. "Automated Single-Voxel Proton MRS: Technical Development and Multisite Verification", *Magnetic Resonance in Medicine,* 31:365–373 (1994), pps. 365–373. Moreover, in using the automated PROBE technique, the SI grid can be automatically shifted to capture a prescribed single voxel. A water reference data can be collected and applied as previously described by Webb et al., supra. The unsuppressed water signal is large relative to any out of volume susceptibility artifacts and hence it need not be collected with phase encoding.

The method of volume magnetic resonance spectroscopy in which phase encoding is selectively used with RF pulses in defining the volume of interest has proved successful in reducing susceptibility artifacts in the imaged data. While the invention has been described with reference to specific embodiments, the description is illustrative of the invention and not be construed as limiting the invention. Various modifications and applications may occur to those skilled in the art without departing from the true spirit and scope of the invention as defined by the appended claims.

What is claimed is:

1. A method of volume magnetic resonance spectroscopy with reduced artifacts comprising the steps of:
   a) placing an object to be imaged in a static magnetic field;
   b) applying a sequence of three RF pulses through said object in the presence of three slice select gradients along each of three principal axes, each RF pulse exciting a plane along an axis which collectively stimulate an echo from a volume of interest,
   c) phase encoding the slices resulting from the first slice select gradient and the third slice select gradient at a resolution greater than or equal to voxel size to resolve and eliminate any out of volume artifacts; and
   d) detecting a localized spectrum signal from a volume intersected by each of the excited columns and further resolving any artifacts outside of the selected volume by phase encoding along the first and third slice select gradient axes.

2. The method as defined by claim 1 wherein
   applying said first and third gradients dephases signals outside of the volume.

3. The method as defined by claim 2, wherein in step c), all three axes are phase encoded at a resolution at least equal to voxel dimensions.

4. The method as defined by claim 2, wherein step c) includes a non-phase encoded water reference scan collected and used to phase and eddy-current correct the resulting spectrum.

* * * * *